United States Patent
Kirby

(10) Patent No.: US 9,714,578 B2
(45) Date of Patent: Jul. 25, 2017

(54) METHOD OF DEPOSITING ABRADABLE COATINGS UNDER POLYMER GELS

(71) Applicant: General Electric Company, Schenectady, NY (US)

(72) Inventor: Glen Harold Kirby, Liberty Township, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/103,261

(22) PCT Filed: Nov. 7, 2014

(86) PCT No.: PCT/US2014/064576
§ 371 (c)(1),
(2) Date: Jun. 9, 2016

(87) PCT Pub. No.: WO2015/126476
PCT Pub. Date: Aug. 27, 2015

(65) Prior Publication Data
US 2016/0312628 A1    Oct. 27, 2016

Related U.S. Application Data

(60) Provisional application No. 61/915,399, filed on Dec. 12, 2013.

(51) Int. Cl.
*C23C 24/00* (2006.01)
*F01D 5/28* (2006.01)
(Continued)

(52) U.S. Cl.
CPC .......... *F01D 5/288* (2013.01); *C04B 35/5156* (2013.01); *C04B 35/624* (2013.01);
(Continued)

(58) Field of Classification Search
CPC ....... C23C 24/00; C23C 24/08; C23C 24/085; F01D 5/28
See application file for complete search history.

(56) References Cited

U.S. PATENT DOCUMENTS

| 4,894,194 A | 1/1990 | Janney |
| 5,602,197 A | 2/1997 | Johnson et al. |

(Continued)

FOREIGN PATENT DOCUMENTS

| CN | 101029395 A | 9/2007 |
| EP | 2287131 A2 | 2/2011 |
| WO | 2011085376 A1 | 7/2011 |

OTHER PUBLICATIONS

International Search Report and Written Opinion issued in connection with corresponding PCT Application No. PCT/US2014/064576 dated Sep. 10, 2015.

(Continued)

*Primary Examiner* — Nathan Empie
(74) *Attorney, Agent, or Firm* — General Electric Company; Brian P. Overbeck

(57) ABSTRACT

A method of depositing abradable coating on an engine component is provided wherein the engine component is formed of ceramic matrix composite (CMC) and one or more layers, including at least one environmental barrier coating, may be disposed on the outer layer of the CMC. An outermost layer of the structure may further comprise a porous abradable layer that is disposed on the environmental barrier coating and provides a breakable structure which inhibits blade damage. The abradable layer may be gel-cast on the component and sintered or may be direct written by extrusion process and subsequently sintered.

13 Claims, 4 Drawing Sheets

(51) Int. Cl.
| | |
|---|---|
| C04B 41/85 | (2006.01) |
| C04B 41/89 | (2006.01) |
| C04B 41/00 | (2006.01) |
| C04B 41/50 | (2006.01) |
| C04B 41/52 | (2006.01) |
| F01D 11/12 | (2006.01) |
| C04B 35/515 | (2006.01) |
| C04B 35/622 | (2006.01) |
| C04B 35/624 | (2006.01) |
| C04B 41/87 | (2006.01) |
| C23C 16/22 | (2006.01) |
| C23C 16/44 | (2006.01) |
| C23C 16/56 | (2006.01) |
| F01D 9/02 | (2006.01) |
| F01D 25/08 | (2006.01) |

(52) U.S. Cl.
CPC .... $C04B\ 35/62222$ (2013.01); $C04B\ 41/0009$ (2013.01); $C04B\ 41/009$ (2013.01); $C04B\ 41/5024$ (2013.01); $C04B\ 41/52$ (2013.01); $C04B\ 41/85$ (2013.01); $C04B\ 41/87$ (2013.01); $C04B\ 41/89$ (2013.01); $C23C\ 16/22$ (2013.01); $C23C\ 16/44$ (2013.01); $C23C\ 16/56$ (2013.01); $F01D\ 5/284$ (2013.01); $F01D\ 9/02$ (2013.01); $F01D\ 11/12$ (2013.01); $F01D\ 11/122$ (2013.01); $F01D\ 11/125$ (2013.01); $F01D\ 25/08$ (2013.01); $C04B\ 2235/3217$ (2013.01); $C04B\ 2235/3272$ (2013.01); $C04B\ 2235/3427$ (2013.01); $F05D\ 2220/32$ (2013.01); $F05D\ 2230/314$ (2013.01); $F05D\ 2240/35$ (2013.01); $F05D\ 2260/231$ (2013.01); $F05D\ 2300/516$ (2013.01); $F05D\ 2300/6033$ (2013.01); $Y02T\ 50/672$ (2013.01)

(56) References Cited

U.S. PATENT DOCUMENTS

| | | |
|---|---|---|
| 6,465,090 B1 | 10/2002 | Stowell et al. |
| 8,501,840 B2 | 8/2013 | Kirby et al. |
| 8,501,849 B2 | 8/2013 | Cruse et al. |
| 2008/0096045 A1* | 4/2008 | Fairbourn ............... C23C 18/04 428/641 |
| 2009/0243585 A1* | 10/2009 | Andarawis ........... G01N 27/041 324/71.2 |
| 2010/0119718 A1 | 5/2010 | Tulyani et al. |
| 2011/0027469 A1 | 2/2011 | Kirby et al. |
| 2011/0027470 A1 | 2/2011 | Kirby et al. |
| 2011/0027476 A1 | 2/2011 | Kirby et al. |
| 2011/0027484 A1 | 2/2011 | Kirby et al. |
| 2011/0027557 A1 | 2/2011 | Kirby et al. |
| 2011/0027558 A1 | 2/2011 | Kirby et al. |
| 2011/0027559 A1 | 2/2011 | Kirby et al. |

OTHER PUBLICATIONS

Unofficial English Translation of Chinese Office Action issued in connection with corresponding CN Application No. 201480067843.1 on Apr. 17, 2017.

* cited by examiner

METHOD OF DEPOSITING ABRADABLE COATINGS UNDER POLYMER GELS

CROSS-REFERENCE TO RELATED APPLICATIONS

This application is a national stage application under 35 U.S.C. §371(c) of prior filed, co-pending PCT application serial number PCT/US2014/064576, filed on Nov. 7, 2014, which claims priority to U.S. provisional patent application Ser. No. 61/915,399, titled "Method of Depositing Abradable Coatings Under Polymer Gels", filed Dec. 12, 2013. The above-listed applications are herein incorporated by reference.

STATEMENT REGARDING FEDERALLY SPONSORED RESEARCH

This invention was made with Government support under Contract No. N00019-04-C-0093 awarded by a Federal Agency. The Government may have certain rights in this invention.

TECHNICAL FIELD

The disclosed embodiments generally pertain to shrouds or blades for gas turbine engines. More particularly, but not by way of limitation, present embodiments relate to deposition of abradable coatings on a shroud or blade.

BACKGROUND

A typical gas turbine engine generally possesses a forward end and an aft end with its several core or propulsion components positioned axially therebetween. An air inlet or intake is located at a forward end of the gas turbine engine. Moving toward the aft end, in order, the intake is followed by a compressor, a combustion chamber, and a turbine. It will be readily apparent from those skilled in the art that additional components may also be included in the gas turbine engine, such as, for example, low-pressure and high-pressure compressors, and low-pressure and high-pressure turbines. This, however, is not an exhaustive list. The gas turbine engine also typically has an internal shaft axially disposed along a center longitudinal axis of the gas turbine engine. The internal shaft is connected to both the high pressure turbine and the high pressure compressor, such that the high pressure turbine provides a rotational input to the high pressure compressor to drive the compressor blades.

Higher operating temperatures for gas turbine engines are continuously being sought in order to improve their efficiency. However, as operating temperatures increase, the high temperature durability of the components of the gas turbine engine must correspondingly increase. Significant advances in high temperature capabilities have been achieved through the formulation of iron, nickel, and cobalt-based superalloys. While superalloys have found wide use for components used throughout gas turbine engines, and especially in the higher temperature areas, alternative lighter-weight component materials have been proposed.

Turbine shrouds and blades may be made of a number of materials, including nickel-based superalloys and ceramic matrix composites (CMCs). CMCs are a class of materials that consist of a reinforcing material surrounded by a ceramic matrix phase. Such materials, along with certain monolithic ceramics (i.e. ceramic materials without a reinforcing material), are currently being used for higher temperature applications. These ceramic materials are lightweight compared to superalloys yet can still provide strength and durability to the component made therefrom. Therefore, such materials are currently being considered for many gas turbine components used in higher temperature sections of gas turbine engines, such as airfoils (e.g. turbines, and vanes), combustors, shrouds and other like components that would benefit from the lighter-weight and higher temperature capability these materials can offer. CMCs are an attractive alternative to nickel-based superalloys for turbine applications because of their high temperature capability and light weight.

Within the high pressure and low pressure turbines, a shroud is a ring of material surrounding the rotating blades. The shroud assembly circumscribes the turbine rotor and defines an outer boundary for combustion gases flowing through the turbines. The turbine shroud may be a single unitary structure or may be formed of a plurality of segments.

Turbine performance and efficiency may be enhanced by reducing the space between the tip of the rotating blade and the stationary shroud to limit the flow of air over or around the top of the blade that would otherwise bypass the blade. This bypass causes loss of efficiency in the gas turbine engine. During engine operation, the blade tips can rub against the shroud, thereby increasing the gap and resulting in a loss of efficiency, or in some cases, damaging or destroying the blades.

For CMC shrouds, damage to metal blade is even more likely since the silicon carbide material is significantly harder than the nickel-based superalloys. For CMC shrouds, an environmental barrier coating is also required for successful performance/survival of the part due to material loss from high temperature steam recession.

In order to reduce the risk associated with coating loss, an abradable layer is deposited on top of the environmental barrier coating to protect from blade rub. It may be desirable that the abradable layer is formed of a series of ceramic ridges that break away upon contact with the rotating blade tip. The ridges are designed to break in order to inhibit damage to the blades during operation.

Abradable coatings have been applied to CMC shroud components to insure breakaway of the abradable coating instead of damaging metal blades. The abradable coatings have been applied by a plasma spray process where only a small fraction of the sprayed material is comprised in the abradable coating. Moreover, if the abradable coating is patterned using a series of abradable ridges, utilization of the material is further reduced, since the coating is sprayed onto a metal mask to only allow material through the mask to form the ridges.

As may be seen by the foregoing, it would be desirable to improve these aspects of gas turbine engine components. For example, it would be desirable to deposit an abradable coating on either of the blade or shroud which inhibits the damage to blades. It would further be desirable to deposit an abradable coating using a method that allows for significantly greater material utilization (i.e. less waste of the material being deposited) particularly since the material involved typically are comprised of at least one rare earth element.

The information included in this Background section of the specification, including any references cited herein and any description or discussion thereof, is included for technical reference purposes only and is not to be regarded subject matter by which the scope of the invention is to be bound.

SUMMARY OF THE INVENTION

According to instant embodiments, a method of depositing abradable coating on a gas turbine engine component is provided. The gas turbine engine component is formed of ceramic matrix composite (CMC) and one or more layers, including at least one environmental barrier coating may be disposed on the outer layer of the CMC. An outermost layer of the structure may comprise a porous abradable layer disposed on the environmental barrier coating and provides a breakable structure which inhibits blade damage. The abradable layer may be cast on the component and sintered or may be directly written on the component by an extrusion process and subsequently sintered.

According to some embodiments, a method of depositing an abradable coating on an gas turbine engine component comprises forming a slurry mixture comprising at least bi-modal ceramic particulate with up to about 70% by volume of coarse particulate wherein the coarse particulate is at least one of $Ln_2Si_2O_7$, $Ln_2SiO_5$, silica, barium strontium aluminosilicate (BSAS), monoclinic hafnium oxide, rare earth gallium garnet ($Ln_2Ga_2O_9$) where Ln is at least one of Scandium (Sc), Yttrium (Y), Lanthanum (La), Cerium (Ce), Phraseodymium (Pr), Neodymium (Nd), Promethium (Pm), Samarium (Sm), Europium (Eu), Gadolimium (Gd), Terbium (Tb), Dysprosium (Dy), Hlomium (Ho), Erbium (Er), Thulium (Tm), Ytterbium (Yb), Lutetium (Lu), and up to about 65% by volume of fine particulate. The fine particulate may include at least one of $Ln_2Si_2O_7$ or $Ln_2SiO_5$ where Ln is at least one of Sc, Y, La, Ce, Pr, Nd, Pm, Sm, Eu, Gd, Tb, Dy, Ho, Er, Tm, Yb, Lu, a polymer solution consisting essentially of one anionic and one cationic dispersant such that the slurry becomes a reversible gel, a low vapor pressure organic solvent and at least one sinter aid selected from the group consisting of iron, aluminum, titanium, cobalt, nickel, gallium, indium, any compounds thereof (e.g. oxides, acetates, oxalates, carbides, nitrides, carbonates, acetylacetonates, nitrates, silicides, compounds containing a rare earth element, mixtures thereof, or mixtures of compounds thereof. The reversible gel slurry is directly written to the gas turbine engine component. The reversible gel slurry is next dried at one of room temperature or a second temperature between about 30° C.-80° C. Finally, the dried reversible gel slurry is sintered on the gas turbine engine component at a temperature greater than about 1204° C. and less than 1357° C., forming a layer of the abradable coating having a thickness greater than about 6 mils and a porosity of about 5 percent to about 50 percent. The sintered layer also comprises of a doped rare earth disilicate where the at least one sintering aid is a doping composition that dissolves into, and dopes the rare earth disilicate.

This Summary is provided to introduce a selection of concepts in a simplified form that are further described below in the Detailed Description. All of the above outlined features are to be understood as exemplary only and many more features and objectives of the embodiments may be gleaned from the disclosure herein. This Summary is not intended to identify key features or essential features of the claimed subject matter, nor is it intended to be used to limit the scope of the claimed subject matter. A more extensive presentation of features, details, utilities, and advantages of the present invention is provided in the following written description of various embodiments of the invention, illustrated in the accompanying drawings, and defined in the appended claims. Therefore, no limiting interpretation of this summary is to be understood without further reading of the entire specification, claims, and drawings included herewith.

BRIEF DESCRIPTION OF THE DRAWINGS

The above-mentioned and other features and advantages of these exemplary embodiments, and the manner of attaining them, will become more apparent and the abradable coatings and method of forming method of depositing will be better understood by reference to the following description of embodiments taken in conjunction with the accompanying drawings, wherein.

DETAILED DESCRIPTION

Figure 1:
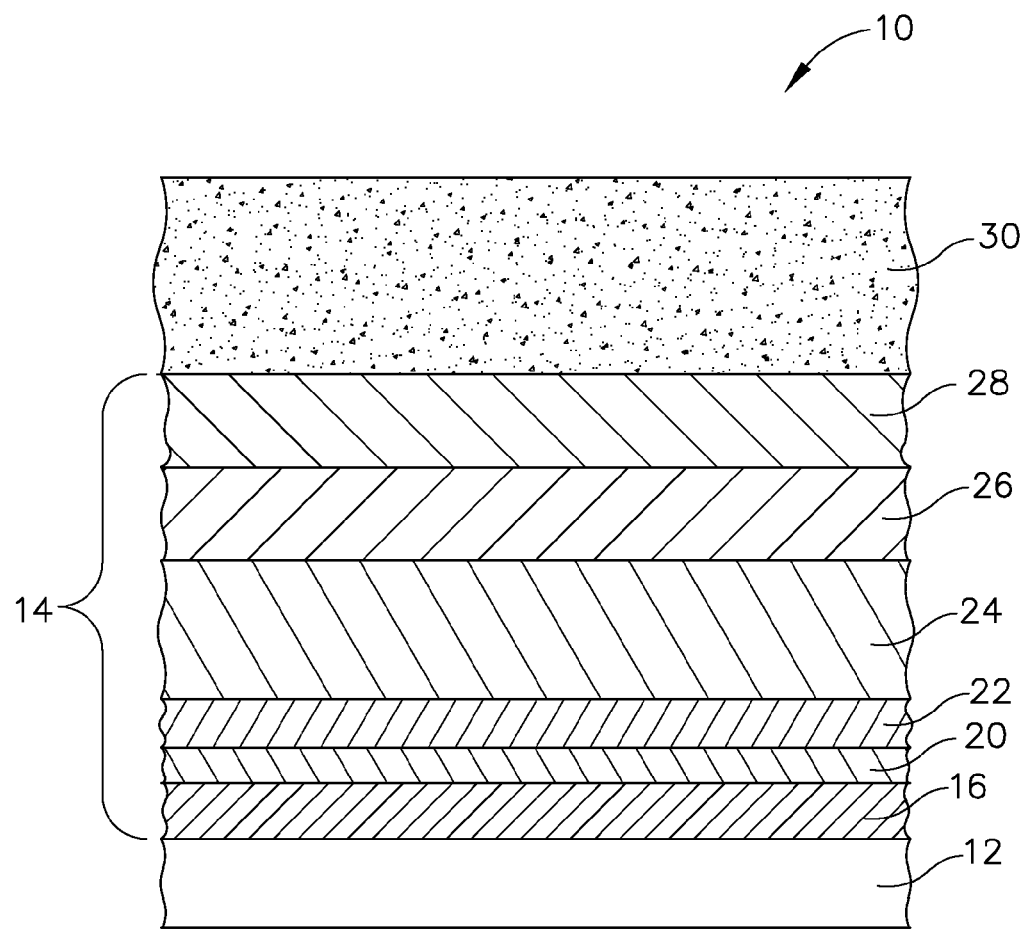
FIG. 1 is a side schematic section view of a coated component having an environmental coating and a porous abradable layer.

Reference now will be made in detail to embodiments provided, one or more examples of which are illustrated in the drawings. Each example is provided by way of explanation, not limitation of the disclosed embodiments. In fact, it will be apparent to those skilled in the art that various modifications and variations can be made in the present embodiments without departing from the scope or spirit of the disclosure. For instance, features illustrated or described as part of one embodiment can be used with another embodiment to still yield further embodiments. Thus it is intended that the present invention covers such modifications and variations as come within the scope of the appended claims and their equivalents.

Referring to FIGS. 1-5, an abradable coating and method of depositing same is provided for use on a ceramic matrix composite (CMC). The process involves making a slurry of at least two particulate sizes including a coarse size and a fine size. The slurry further comprises sintering aids. The slurry is placed on a component and within a mold according to one embodiment and gelled. In alternative embodiments, the gelled slurry is directly written on the component by extrusion. The gelled slurry is dried and sintered leaving the deposited abradable coating on either of the gas turbine engine component or an environmental barrier coating. The environmental barrier coating (EBC) results in improved manufacture, operation or performance.

More specifically, the EBCs described herein comprise sintering aids, which can lower the sintering temperature, thereby promoting the formation of dense EBC layers that can act as a hermetic seal to protect the underlying component from corrosion from the gases generated during high temperature combustion without damaging the component through exposure to high sintering temperatures, as explained herein below. Additionally, the formation may be of a porous abradable layer which breaks when contacted, for example by a rotor component such as a blade.

The EBCs described herein may be suitable for use in conjunction with CMCs or monolithic ceramics. "CMCs" refers to silicon-containing matrix and reinforcing materials. The composite material may be formed or constructed of various low ductility and low coefficient of thermal expansion materials including but not limited to a ceramic matrix composite (CMC). Generally, as used herein, CMC materials include a ceramic fiber, for example a silicon carbide (SiC), forms of which are coated with a compliant material such as boron nitride (BN). Some examples of CMCs acceptable for use herein can include, but should not be limited to, materials having a matrix and reinforcing fibers comprising silicon carbide, silicon nitride, and mixtures thereof. As used herein, "monolithic ceramics" refers to materials comprising silicon carbide, silicon nitride, and mixtures thereof. Herein, CMCs and monolithic ceramics may also collectively be referred to as "ceramics."

Typically, the CMCs may be constructed of other low-ductility, high-temperature-capable materials. CMC materials generally have room temperature tensile ductility of less than or equal to about 1% which is used herein to define a low tensile ductility material. Generally, CMC materials have a room temperature tensile ductility in the range of about 0.4% to about 0.7%.

CMC materials have a characteristic wherein the materials tensile strength in the direction parallel to the length of the fibers (the "fiber direction") is stronger than the tensile strength in the direction perpendicular. This perpendicular direction may include matrix, interlaminar, secondary or tertiary fiber directions. Various physical properties may also differ between the fiber and the matrix directions.

A coated engine component may incorporate one or more layers of environmental barrier coating, which may be an abradable material, and/or a rub-tolerant material of a known type suitable for use with CMC materials, on a surface of the component. This layer is sometimes referred to as a "rub coat". As used herein, the term "abradable" implies that the rub coat is capable of being abraded, ground, or eroded away during contact between two parts, for example with little or no resulting damage to the moving part, for example a turbine blade tip. This abradable property may be a result of the material composition of the rub coat, by its physical configuration or by some combination thereof. The rub coat may comprise a ceramic layer such as yttria stabilized zirconia, rare earth disilicate, or barium strontium aluminosilicate. As used herein, the term "barrier coating(s)" can refer to environmental barrier coatings (EBCs). The EBCs herein may be suitable for use on "ceramic component," or simply "component" found in high temperature environments (e.g. operating temperatures of above 2100° F. (1149° C.)), such as those present in gas turbine engines. Examples of such ceramic components can include, for example, combustor components, turbine blades, shrouds, nozzles, heat shields, and vanes.

Referring initially to FIG. 1, the coated engine component 10, for non-limiting example, such as a turbine blade or a shroud. The coated engine component 10 is defined by a base CMC structure 12. The base CMC structure 12 may further have at least one EBC 14 which may comprise one or more layers. According to one embodiment, the EBC 14 may comprise a bond coat layer 16, for example a hermetic bond coat, which is of higher density for sealing against high temperature steam recession and inhibiting damage to the components from exposure to high sintering temperatures. Disposed outside of the bond coat layer 16 may be the abradable rub coating or abradable layer 30. More specifically, EBC 14 may comprise a coating system including various combinations of the following: an optional bond coat layer 16, an optional amorphous silica layer 20, at least one transition layer 22, an optional compliant layer 24, an optional intermediate layer 26, and an optional outer layer 28, as shown generally in FIG. 1 and as set forth herein below. On either the base CMC structure 12 or the EBC 14 is the abradable layer 30 which is deposited by a slurry gel. Otherwise stated, the abradable layer may be applied to the EBC 14 or directly to the gas turbine engine component 30.

Bond coat layer 16 may comprise silicon metal, silicide, or a combination thereof, and may generally have a thickness of from about 0.1 mils to about 6 mils (about 2.5 to about 150 micrometers). Due to the application method as described herein below, there may be some local regions where the silicon bond coat is missing, which can be acceptable. For example, in one embodiment, bond coat layer 16 can cover about 100% of the surface of base CMC structure 12, and in another embodiment, about 90% or more of the surface area of the base CMC structure 12.

As used herein "silicide" may include rare earth (Ln) silicides, chromium silicide (e.g. $CrSi_3$), niobium silicide (e.g. $NbSi_2$, $NbSi_3$), molybdenum silicide (e.g. $MoSi_2$, $Mo_5Si_3$, $MoSi_3$), tantalum silicide (e.g. $TaSi_2$, $TaSi_3$), titanium silicide (e.g. $TiSi_2$, $TiSi_3$), tungsten silicide (e.g. $WSi_2$, $W_5Si_3$), zirconium silicide (e.g. $ZrSi_2$), hafnium silicide (e.g. $HfSi_2$), rhenium silicides, and combinations or alloys thereof.

As used herein, "rare earth" represented "(Ln)" refers to the rare earth elements of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and mixtures thereof.

Amorphous silica layer 20 has an initial thickness of from about 0.0 mils to about 0.2 mils. However, the thickness of the amorphous silica layer 20 can increase over time. Specifically, the silicon in bond coat layer 16 can oxidize slowly during the service life of the EBC to gradually increase the thickness of amorphous silica layer 20. This oxidation of bond coat layer 16 can protect the underlying ceramic component from oxidation since the bond coat is oxidized rather than the ceramic component, and since the rate of oxygen diffusion through the amorphous silica layer is slow. Amorphous silica layer 20 can, in some embodiments, also be doped with a doping composition, as defined herein below, due to diffusion of a "doping composition" into the amorphous silica layer 20.

As described in U.S. Pat. No. 8,501,840, issued by Kirby et. al. and which is incorporated by reference herein (hereinafter "Kirby et. al."), a transition layer 22 may comprise a rare earth disilicate, a doped rare earth disilicate, or a doped rare earth disilicate containing secondary materials, as defined below. More specifically, transition layer 22 may include from about 85% to about 100% by volume of the transition layer of a primary transition material and up to about 15% by volume of the transition layer of a secondary material, and in one embodiment from about 85% to about 99% by volume of the transition layer of the primary transition material and from about 1% to about 15% by volume of the transition layer of the secondary material. In another embodiment, transition layer 22 may comprise 100% primary transition material wherein the primary transition material can be doped, as described below.

As used herein, "primary transition material" refers to a rare earth disilicate ($Ln_2Si_2O_7$), or a doped rare earth disilicate. As used herein, "doped rare earth disilicate" refers to $Ln_2Si_2O_7$ doped with a "doping composition" selected from the group consisting of iron, aluminum, gallium, indium, titanium, nickel, cobalt, rare earth (Lnb), oxides thereof (e.g. $Fe_2O_3$, $Fe_3O_4$, $Al_2O_3$, $Ga_2O_3$, $In_2O_3$, NiO, $Co_3O_4$, $TiO_2$, $Lnb_2O_3$) compounds thereof (e.g. $Lnb_2Si_2O_7$, $Lnb_2SiO_5$, iron silicates, nickel silicates, cobalt silicates, mullite, rare earth aluminum oxides, rare earth titanium oxides, rare earth gallium oxides, rare earth indium oxides, etc), and mixtures thereof. "Doped" refers to the condition where the doping composition is dissolved into the primary material, which can occur by the doping composition cation substituting on either the Ln or Si site of the $Ln_2Si_2O_7$ (as in the case of the Lnb that substitutes on the Ln site using the $Lnb_2Si_2O_7$ doping composition), due to the doping composition cation occupying an interstitial site, or due to some combination of these effects. Any doping composition present in the primary material, if at a level that exceeds the solubility limit in the primary material, may partially dissolve into the primary material with heat treatment, with the rest not dissolving to become secondary material, or participating in a reaction to form secondary material (e.g. Fe-doped $Ln_2Si_2O_7$ with $Fe_2O_3$ secondary material; Fe-doped $Ln_2Si_2O_7$ with $Ln_3Fe_5O_2$ secondary material, Ti-doped $Ln_2Si_2O_7$ with $TiO_2$ secondary material; or Ni-doped $Ln_2Si_2O_7$ with rare earth nickel oxide secondary material).

In reference to the embodiments herein, "Lnb rare earth metal", or simply "Lnb" refers to a sub-set of rare-earth metals where Lnb is not the same rare earth as Ln.

"Iron silicates" can include compounds such as $Fe_2SiO_4$, and glasses of rare earth iron silicates. "Rare earth iron oxides" can include compounds such as garnets ($Ln_3Fe_5O_{12}$), monoclinic ferrites ($Ln_4Fe_2O_9$), and perovskites ($LnFeO_3$). "Rare-earth aluminum oxides" can include compounds such as garnets ($Ln_3Al_5O_{12}$), monoclinic aluminates ($Ln_4Al_2O_9$), and perovskites ($LnAlO_3$). "Rare earth aluminum oxides" can also include glassy materials comprised of about 35-50 wt % $Ln_2O_3$, about 15-25 wt % $Al_2O_3$, and about 25-50 wt % $SiO_2$. "Rare-earth titanium oxides" can include compounds such as $Ln_2Ti_2O_7$ (pyrochlore) and $Ln_2TiO_5$. "Rare-earth gallium oxides" can include compounds such as garnets ($Ln_3Ga_5O_{12}$), monoclinic gallates ($Ln_4Ga_2O_9$), perovskites ($LnGaO_3$), and $Ln_3GaO_6$. "Rare-earth indium oxides" can include compounds such as garnets ($Ln_3In_5O_{12}$) and perovskites ($LnInO_3$). "Nickel silicates" can include compounds such as $Ni_2SiO_4$, "Cobalt silicates can include compounds such as $Co_2SiO_4$.

Each transition layer 22 may have a thickness of from about 0.1 mils to about 5 mils, and may be made and applied to the underlying layer as set forth below. In one embodiment, there may be more than one transition layer present. In such instances, each transition layer may comprise the same or different combination of primary transition materials and secondary materials. In the case where each transition layer comprises the same combination of primary transition materials and secondary materials, the thickness can be built up in a step-by-step manner. Transition layer 22 may have a porosity level of from 0% to about 15% by volume of the transition layer, and in another embodiment, from about 0.01% to about 15% by volume of the transition layer. In this way, the transition layer 22 is dense enough to be hermetic and thus seal against high temperature steam. In another embodiment, the transition layer 22 is comprised of a primary transition material that is a doped rare earth disilicate, a secondary transition material, and porosity. In this embodiment, the sum of the pore volume and the secondary transition material volume is of a level from 0% to about 15% by volume of the transition layer. This embodiment ensures a transition layer that is hermetic to high temperature steam if the secondary material completely volatilizes in service, such that porosity is left in its place.

Similarly, as described by Kirby et al., outer layer 28 may comprise a rare earth monosilicate, a doped rare earth monosilicate, or a doped rare earth monosilicate containing secondary material. More specifically, outer layer 28 can include from about 85% to about 100% by volume of the outer layer of a primary outer material and up to about 15% by volume of the outer layer of the previously defined secondary material, and in one embodiment from about 85% to about 99% by volume of the layer of a primary outer material and from about 1% to about 15% by volume of the outer layer of the secondary material. In another embodiment, outer layer 28 may comprise 100% primary outer material wherein the primary outer material can be doped as described below.

As used herein, "primary outer material" refers to a rare earth monosilicate, or a doped rare earth monosilicate. As used herein, "doped rare earth monosilicate" refers to $Ln_2SiO_5$ doped with a doping composition as defined previously. Again, doping composition refers to the condition where the doping composition is dissolved into the primary material, which can occur by the doping composition cation substituting on either the Ln or Si site of the $Ln_2SiO_5$ (as in the case of the Lnb that substitutes on the Ln site), due to the doping composition cation occupying an interstitial site, or due to some combination of these effects. Like the primary transition layer material, if the solubility limit of the doping composition in the primary outer material is exceeded, a secondary material as described above will be present. Outer layer 28 may have a thickness of from about 0.1 mils to about 3 mils, and may be made and applied to the underlying layer as set forth below. In one embodiment, the outer layer 28 may have a porosity level of from 0% to about 30% by volume of the outer layer 28, and in another embodiment, from about 0.01% to about 30% by volume of the outer layer 28, and in another embodiment, from about 0.01% to about 15% by volume of the outer layer 28. In some embodiments, the outer layer 28 can comprise cracks therein at a density of up to about 10 cracks/mm that can form during operation due to thermal expansion anisotropy and thermal expansion mismatch with underlying material.

Although the porosity and cracking in the outer layer 28 allows high temperature steam to pass through, the outer layer 28 is recession resistant—meaning that it does not react with the high temperature steam in service to result in a volume change. The underlying transition layer 22, on the other hand, is hermetic and prevents the high temperature steam from passing through to the bond coat or CMC as discussed above.

If present, compliant layer 24 may include from about 85% to about 100% by volume of the compliant layer of a primary compliant material and up to about 15% by volume of the compliant layer of a secondary compliant material, and in one embodiment from about 85% to about 99% by volume of the compliant layer of a primary compliant material and from about 1% to about 15% by volume of the compliant layer of the secondary compliant material. In another embodiment, compliant layer 24 may comprise 100% by volume of the compliant layer of a primary compliant material wherein the primary outer material may be doped with a rare earth element.

As used herein, "primary compliant material" refers to BSAS, or a rare earth doped BSAS (where the doping composition is comprised of at least one rare earth element, oxide, or compound with barium, strontium, aluminum, or silicon), while "secondary compliant material" refers to $Ln_2O_3$, $Ln_2Si_2O_7$, $Ln_2SiO_5$, $Ln_3Al_5O_{12}$, mullite, and combinations thereof. Compliant layer 24 may have a thickness of from about 0.1 mils to about 40 mils, and may be made and applied as set forth below. In one embodiment, compliant layer 24 may have a porosity level of from 0% to about 30% by volume of the compliant layer, and in another embodiment, from about 0.01% to about 30% by volume of the compliant layer, and in another embodiment, from about 0.01% to about 15% by volume of the compliant layer.

Intermediate layer 26, if present, can comprise the previously defined primary outer materials of rare earth monosilicate or doped rare earth monosilicate. Similar to the amorphous silica layer 20, intermediate layer 26 can form during the service life of the EBC 14. More specifically, high temperature steam penetrates the outer layer 28, and as the steam reacts with the primary transition material of the transition layer to volatilize $SiO_2$, intermediate layer 26 can form.

Like the transition layer 22, the abradable layer 30 may comprise a rare earth disilicate, a doped rare earth disilicate, or a doped rare earth disilicate containing secondary materials. More specifically, abradable layer 30 may include from about 85% to about 100% by volume of the abradable layer 30 of a primary material and up to about 15% by volume of the abradable layer 30 of a secondary material, and in one embodiment from about 85% to about 99% by volume of the abradable layer 30 of the primary material and from about 1% to about 15% by volume of the abradable layer of the secondary material. In another embodiment, abradable layer 30 may comprise 100% primary material wherein the primary material can be doped as described above.

A doping composition for the abradable layer 30 can be selected from the group consisting of iron, aluminum, gallium, indium, titanium, nickel, cobalt, oxides thereof (e.g. $Fe_2O_3$, $Fe_3O_4$, $Al_2O_3$, $Ga_2O_3$, $In_2O_3$, $NiO$, $Co_3O_4$, $TiO_2$, etc) compounds thereof (e.g. $Lnb_2Si_2O_7$, rare earth aluminum oxides, rare earth titanium oxides, rare earth gallium oxides, rare earth indium oxides, etc), and mixtures thereof. "Doped" refers to the condition where the doping composition is dissolved into the primary material, which can occur by the doping composition cation substituting on either the Ln or Si site of the $Ln_2Si_2O_7$ (as in the case of the Lnb that substitutes on the Ln site), due to the doping composition cation occupying an interstitial site, or due to some combination of these effects. Any doping composition present in the primary material, if at a level that exceeds the solubility limit in the primary material, may partially dissolve into the primary material with heat treatment, with the rest not dissolving to become secondary material, or participating in a reaction to form secondary material (e.g. Fe-doped $Ln_2Si_2O_7$ with $Fe_2O_3$ secondary material; Fe-doped $Ln_2Si_2O_7$ with $Ln_3Fe_5O_{12}$ secondary material, Ti-doped $Ln_2Si_2O_7$ with $TiO_2$ secondary material; or Ni-doped $Ln_2Si_2O_7$ with rare earth nickel oxide secondary material).

The abradable layer 30 may be thicker than the other layers, for example greater than 5 mils and up to 60 mils, for example). Additionally, the layer is porous (up to 50 percent porosity by volume) to encourage breakage of the layer during operation and decreased rub force which might alternatively result in unintended breakage of a part, for example turbine blade or shroud.

By way of example, and not limitation, the EBC systems described herein may include in one embodiment, base CMC structure 12, bond coat layer 16, transition layer 22 and an abradable layer 30; in another embodiment, base CMC structure 12, bond coat layer 16, transition layer 22, outer layer 28, and abradable layer 30; in another embodiment, base CMC structure 12, bond coat layer 16, transition layer 22, compliant layer 24, outer layer 28 and abradable layer 30; in another embodiment, base CMC structure 12, bond coat layer 16, transition layer 22, compliant layer 24, transition layer 22, outer layer 28, and abradable layer 30; in another embodiment, base CMC structure 12, bond coat layer 16, amorphous silica layer 20, and transition layer 22; in another embodiment, base CMC structure 12, bond coat layer 16, amorphous silica layer 20, transition layer 22, outer layer 28, and abradable layer 30; in another embodiment, base CMC structure 12, bond coat layer 16, amorphous silica layer 20, transition layer 22, compliant layer 24, outer layer 28, and abradable layer 30; in another embodiment, base CMC structure 12, bond coat layer 16, amorphous silica layer 20, transition layer 22, compliant layer 24, transition layer 22, outer layer 28, and abradable layer 30; in another embodiment, base CMC structure 12, bond coat layer 16, transition layer 22, intermediate layer 26, outer layer 28, and abradable layer 30; in another embodiment, base CMC structure 12, bond coat layer 16, amorphous silica layer 20, transition layer 22, intermediate layer 26, outer layer 28, and abradable layer 30; in another embodiment, base CMC structure 12, bond coat layer 16, amorphous silica layer 20, transition layer 22, intermediate layer 26 (which can form during operation), outer layer 28, and abradable layer 30; and in another embodiment, base CMC structure 12, bond coat layer 16, amorphous silica layer 20, transition layer 22, compliant layer 24, transition layer 22, intermediate layer 26 (which can form during operation), outer layer 28, and abradable layer 30. Such embodiments can be suitable for use in environments having a temperature up to about 1704° C. (3100° F.).

Alternately, the EBC system may comprise base CMC structure 12, bond coat layer 16, transition layer 22, compliant layer 24, and abradable layer 30; in another embodiment, base CMC structure 12, bond coat layer 16, amorphous silica layer 20, transition layer 22, compliant layer 24, and abradable layer 30. Such embodiments can be suitable for use in environments having a temperature of up to about 1538° C. (2800° F.).

Those skilled in the art will understand that embodiments in addition to those set forth previously are also acceptable, and that not all of the layers need to be present initially, but rather, may form during engine operation. Still further, the abradable layer 30 may alternatively be applied directly to the engine component or structure 12, without use of the environmental coating 14 or any of the associated layers, 16, 20, 22, 24, 26 and 28. The abradable layer 30 may therefore also function as a thermal barrier coating. According to some embodiments, the use of larger fractions of fine particulate may provide for higher density and therefore more robust thermo-cycling. Further, the use of BSAS or Silicone powders, particularly as all or a portion of the coarse particulate fraction, also provide for improved densification, improved thermo-cycling.

The EBC system 10, including the abradable layer 30, can be made and applied in accordance with the description below. There are primarily two methods of making the abradable layer 30. According to one method, a slurry is formed and is gel-casted on the component. According to a second method, the slurry is formed and is direct-written on the component by an extrusion process. In both cases, most if not all of the slurry deposited on the component is fully utilized in the final coating (i.e., there is very low waste as compared to a plasma spray process).

The bond coat layer 16 may be formed on the component in a variety of manners. Bond coat layer 16 may be applied by plasma spray processes, chemical vapor deposition processes, electron beam physical vapor deposition processes, dipping in molten silicon, sputtering processes, electroplating, and other conventional application processes known to those skilled in the art.

As previously described, amorphous silica layer 20 can form during the service life of the EBC. Specifically, oxygen in the surrounding atmosphere can diffuse through any of the outer layer, compliant, and transition layer(s) present in the EBC and react with the silicon of bond coat layer 16 to form amorphous silica layer 20. Alternately, amorphous silica layer 20 may be intentionally deposited by chemical vapor deposition, plasma spray, or other conventional method.

Similar to amorphous silica layer 20, intermediate layer 26 can also form during the service life of the EBC when high temperature steam reacts with transition layer 22, as previously described.

The manufacturing and application process for formation of the transition layer 22, compliant layer 24 and outer layer 28 can consist of deposition of a slurry, followed by drying and heat treatment to remove liquids and other organic processing aids, and heat treatment to densify layers. Slurries are solvent or aqueous-based and comprise fine particles of the primary composition appropriate for each respective layer, sintering aids to lower the temperature needed to densify a layer, and other organic processing aids. In such slurries, the sintering aid is also the doping composition. One embodiment entails the use of the sintering aid at a concentration that provides the maximum heat treatment reduction to yield coatings of the highest density possible at temperatures of 2200 F.-2450 F., where the coating becomes a sintering aid doped-primary composition without the formation of any secondary material. The process for this deposition is discussed in Kirby et. al. In another embodiment, transition layer 22, compliant layer 24 and outer layer 28 are formed by thermal spray (e.g. air plasma spray).

Figure 2:
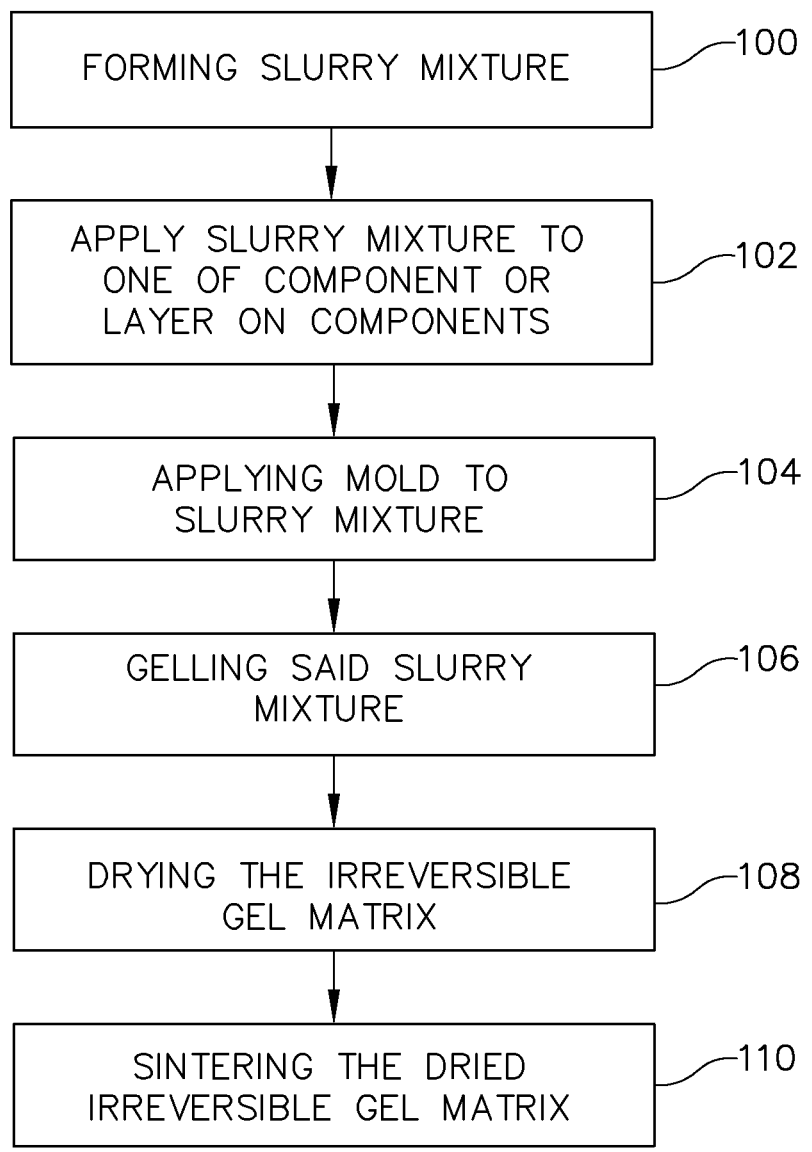
FIG. 2 is a flow chart depicting a method of forming the coated component.

With reference additionally to FIG. 2, the manufacturing process of the abradable layer 30 consists of a pourable slurry that is deposited, crosslinked to form an irreversible gel (i.e., a gel that cannot be converted back to a flowing liquid with applied shear), heat treated ("dried") to remove liquids and burn-out the crosslinked polymer, and finally, heat-treated to densify the layer. This approach is referred to as the "gel-casting" approach. Specifically, the slurry is formed at step 100 and applied to a gas turbine engine component 10 at step 102. A mold is applied to the slurry mixture at step 104. Next the slurry is gelled at step 106. In the subsequent step, the irreversible gel matrix is dried at step 108. After drying, the dried irreversible gel matrix is sintered at step 110.

Figure 3:
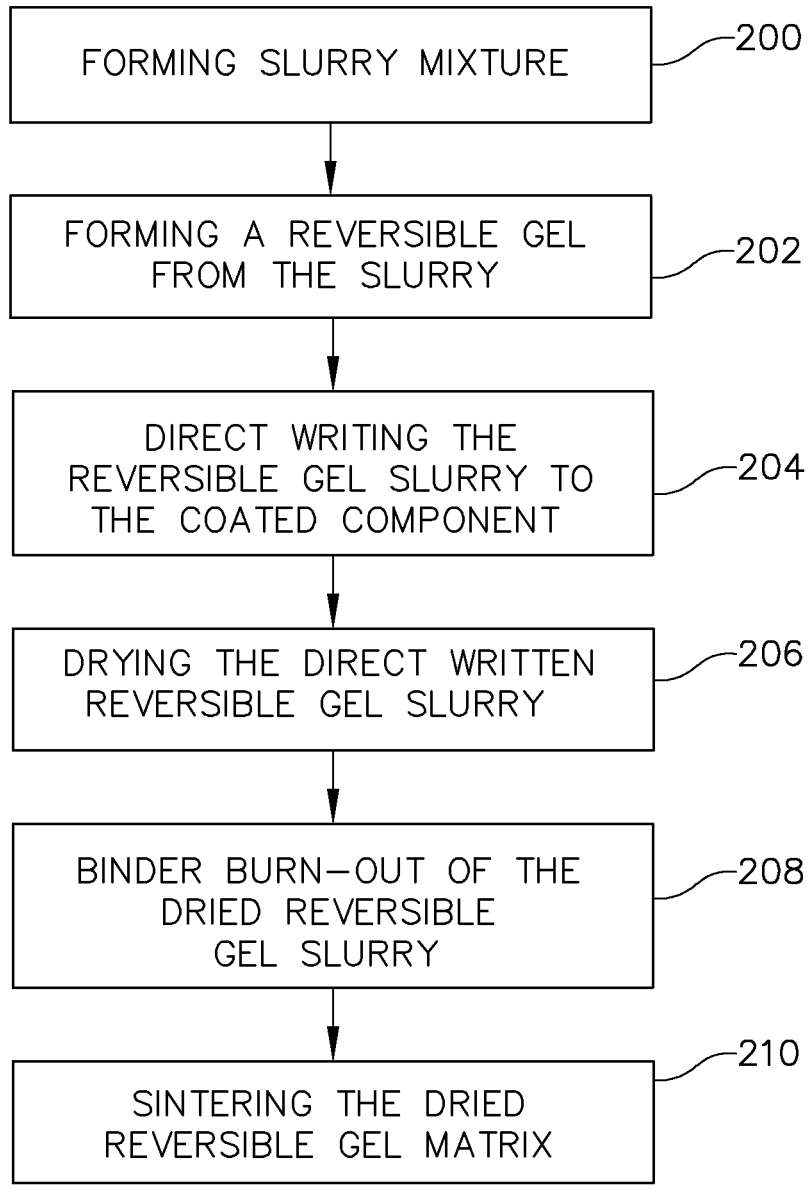
FIG. 3 is a flow chart depicting a second method of forming the coated component.

With reference additionally to FIG. 3, in another embodiment, the abradable layer 30 is deposited from a strongly shear-thinning slurry, or reversible gel (i.e. a gel that is converted back to a flowing liquid with applied shear). This approach lends itself to extrusion of the slurry through a syringe to form tall, abradable ridges through a "direct-write" process. Applied shear promotes flow of the slurry through the syringe, but the once the shear is removed, the gel rapidly resets to prevent flow under the force of gravity. Specifically, in this embodiment, the slurry is formed at step 200 and a reversible gel is formed from the slurry at step 202. The reversible gel slurry is direct-written to a gas turbine engine component at step 204. Next, the direct written reversible gel slurry is dried at step 206. After being dried, the binder is burned out of the dried reversible slurry 208. Finally, the dried reversible gel slurry is sintered at step 210.

Slurries utilized in the "gel-casting" (irreversible gel) and "direct-write" (reversible gel) approaches to form abradable layers have some commonality. Slurries in both approaches are comprised of rare earth disilicate primary materials. The rare earth disilicate may include but is not limited to any of the previously mentioned rare earth disilicate materials including $Yb_2Si_2O_7$, Y2Si2O7, Lu2Si2O7, and combinations of such.

The primary materials in the abradable slurries are formed of particles of at least two average sizes, or "modes", including a coarse particulate and a fine particulate. The fine particulate may comprise any rare earth disilicate or rare earth monosilicate, that is Ln2Si2O7 or Ln2SiO5 where Ln can be Scandium (Sc), Yttrium (Y), Lanthanum (La), Cerium (Ce), Phraseodymium (Pr), Neodymium (Nd), Promethium (Pm), Samarium (Sm), Europium (Eu), Gadolimium (Gd), Terbium (Tb), Dysprosium (Dy), Hlomium (Ho), Erbium (Er), Thulium (Tm), Ytterbium (Yb), Lutetium (Lu), and combinations thereof. The coarse particulate may comprise any rare earth disilicate, any rare earth monosilicate, both described above, barium strontium aluminosilicate (BSAS), monoclinic hafnium oxide, rare earth gallium garnet (Ln2Ga2O9 where Ln can be Sc, Y, La, Ce, Pr, Nd, Pm, Sm, Eu, Gd, Tb, Dy, Ho, Er, Tm, Yb, Lu, and combinations thereof), mullite, silicon metal, silicon carbide, silicon nitride, tantalum oxide, aluminum tantalate, silicon oxide, and combinations thereof. According to some embodiments, the coarse particle may have an average size ranging from about 2 micrometers to about 100 micrometers. The fine particle material may have an average particle size equal to or less than about 2 micrometers. The content of low surface area coarse particles reduces stress in the drying and sintering processes that would otherwise cause cracking in the layer or coating. Such drying and sintering stresses increase with coating thickness. Thus, the use of coarse particulate that lessens drying and sintering stress is a key factor in achieving greater thickness of the abradable layer, i.e. layers exceeding 5 mils and up to 40 mils that are crack-free after a single heat treatment. The porosity in the layer also increases somewhat with increasing coarse fraction, as it takes away some of the driving force for densification during the sintering heat treatment. Note, sintering is the process that occurs when a high surface area layer of consolidated particles diffuse together, reducing porosity, to form a low surface area cohesive layer. The driving force for this process is reduction of the high surface energy possessed by the high surface area, fine particles. Thus, the presence of the fine particulate with high surface area ensures that such a process occurs during heat treatment to give strength and reduce porosity by sintering around the coarse particles. Furthermore, the presence of any sintering aid described herein allows for sintering of the fine particulate around the coarse particles at lower temperature than in the absence of the sintering aid. Because the coarse particles have low surface area compared to the fine particles, porosity in the layer does increase somewhat with increasing coarse fraction, as it takes away some of the driving force for densification during the sintering heat treatment. The blend of coarse and fine particulate allows the freedom to make thicker, crack-free, yet more porous layers with a single slurry (or gel) application, drying, and sintering cycle than the use of fine particulate alone. According to some embodiments, the bi-modal particulate may comprise up to 70% by volume of coarse material and up to 65% by volume of fine material. After sintering such embodiments, the amount of porosity may be up to 45% by coating volume, and have a maximum, crack-free thickness of about 40 mils.

The chemistry of the coarse particle fraction can be chosen in such a way to minimize the porosity in the coating, despite the fact that low surface area particulate is introduced. BSAS, silicon metal, mullite, and silicon, for example, as a fraction or whole of the coarse particulate can promote less porosity in the coating after sintering than if the coarse fraction is from the same material as the fine particulate (i.e., rare earth disilicate). This effect may be due to compliant behavior, or formation of a liquid phase directly adjacent to the coarse particles (of BSAS, silicon metal, mullite, or silicon oxide) during sintering to promote better densification around the coarse particles.

The coarse particles may be comprised of spheroidal particles, but also may be particles that are prolate with aspect ratios of up to 50 to 1. The prolate particles may impart additional strength to the coating layer, however, this is also balanced by increased porosity that can occur due to interference in the fine particle densification around such particles during sintering heat treatment.

As used herein, "slurry sintering aid" can refer to sintering aid compositions suitable for inclusion in the slurry. In some embodiments, there can be from about 0.01 wt % to about 5 wt %, and in some embodiments from about 0.01 wt % to about 50 wt %, Abradable layer slurries also include a sintering aid which may be from the group consisting of metal particles including iron, carbonyl iron, aluminum, nickel, cobalt, indium, gallium, rare earth (Lnn), alloys thereof, alloys thereof with silicon, and alloys thereof with rare earth metals; non soluble oxide particles including: iron oxide (e.g, $Fe_2O_3$, $Fe3O4$), iron silicates, rare earth iron oxides, $Al_2O_3$, mullite, rare earth aluminates, rare earth aluminosilicates, $TiO_2$, rare earth titanates, gallium oxide, indium oxide, rare earth gallates, rare earth indates, NiO, cobalt oxide, nickel silicates, cobalt silicates, rare earth nickel oxides, and $Lnb_2Si_2O_7$, and combinations thereof. The sintering aids may also be non-soluble, non-oxide particles that convert to oxides on heat treatment in air including iron carbide, iron nitride, aluminum nitride, aluminum carbide, gallium nitride, indium nitride, titanium nitride, titanium carbide, nickel carbide, nickel nitride, cobalt nitride, and cobalt carbide; hydroxides including iron hydroxide, gallium hydroxide, indium hydroxide, aluminum hydroxide, nickel hydroxide, cobalt hydroxide, titanium hydroxide; carbonates including iron carbonate, gallium carbonate, indium carbonate, titanium carbonate, aluminum carbonate, nickel carbonate, and cobalt carbonate; oxalates including iron oxalate, gallium oxalate, aluminum oxalate, titanium oxalate, nickel oxalate, and cobalt oxalate.

The sintering aids may also be solvent or water soluble sintering aid "salts" containing a cation of iron, aluminum, titanium, gallium, indium, nickel, cobalt, or mixtures thereof, that precipitate upon drying and convert to an oxide form during heat treatment. Such "salts" include nitrates, chlorides, acetates, acetoacetonates. Examples of solvent soluble salts also include: iron ethoxide, iron 2,4-pentanedionate, and iron tetramethylheptanedionate; "solvent-soluble gallium salts" can include gallium 8-hydroxyquinolinate, gallium 2,4-pentanedionate, gallium ethoxide, gallium isopropoxide, and gallium 2,2,6,6-tetramethylheptanedionate; "solvent-soluble aluminum salts" can include butoxide, aluminum di-s-butoxide ethylacetoacetate, aluminum diisopropoxide ethylacetoacetate, aluminum ethoxide, aluminum ethoxyethoxyethoxide, aluminum 3,5-heptanedionate, aluminum isopropoxide, aluminum 9-octadecenylacetoacetate diisopropoxide, aluminum 2,4-pentanedionate, aluminum pentanedionate bis(ethylacetoacetate), aluminum 2,2,6,6-tetramethyl-3,5-heptanedionate, and aluminum phenoxide; "solvent-soluble nickel salts" can include nickel 2,4-pentanedionate, nickel 2,2,6,6-tetramethyl-3-5-heptanedionate; "solvent-soluble titanium salts" can include titanium allylacetoacetatetriisopropoxide, titanium bis(triethanolamine)diisopropoxide, titanium butoxide, titanium di-n-butoxide bis(2-ethylhexanoate), titanium diisopropoxide (bis-2,4-pentanedionate), titanium diisopropoxide bis (tetramethylheptanedionate, titanium ethoxide, titanium diisopropoxide bis(ethylacetoacetate), titanium 2-ethylhexoxide, titanium iodide triisopropoxide, titanium isobutoxide, titanium isopropoxide, titanium methacrylate triisopropoxide, titanium methacryloxyethylacetoacetate triisopropoxide, titanium methoxide, titanium methoxypropoxide, titanium methylphenoxide, titanium n-nonyloxide, titanium oxide bis(pentanedionate), titanium oxide bis (tetramethylheptanedionate), and titanium n-propoxide; "solvent-soluble boron salts" can include boron ethoxide, boron butoxide, boron isopropoxide, boron methoxide, boron methoxyethoxide, boron n-propoxide; and "solvent-soluble alkaline earth salts" can include calcium isopropoxide, calcium methoxyethoxide, calcium methoxide, calcium ethoxide, strontium isopropoxide, strontium methoxypropoxide, strontium 2,4-pentanedionate, strontium 2,2,6,6-tetramethyl-3,5-heptanedionate, magnesium ethoxide, magnesium methoxide, magnesium methoxyethoxide, magnesium 2,4-pentanedionate, magnesium n-propoxide, barium isopropoxide, barium methoxypropoxide, barium 2,4-pentanedionate, barium 2,2,6,6-tetramethyl-3,5-heptanedionate.

Sintering aids lower the temperature necessary for the particles (particularly the fine particles) to sinter to around 2200 F.-2450 F. In the absence of such sintering aids, the sintering process does not occur until temperatures in excess of 2700 F.—temperatures that surely degrade the mechanical properties of the substrate. Ultimately, after heat treatment, these sintering aids also become the doping composition that is dissolved into the primary material. The sintering aid concentration is also kept as low as possible to provide the enhanced sintering effect without producing any secondary material in an embodiment, but less than 15 percent by volume of secondary material in another embodiment.

In order to take advantage of the thick coating capability offered by the use of the multimodal EBC slurries comprising coarse and fine particulate as well as sintering aids, slurry deposition strategies must be utilized that prevent settling of the coarse particulate, prevent sagging and flow (running) of the deposited slurry under the influence of gravity, and maintain attachment to the substrate throughout drying and sintering processes. In contrast, EBC coatings described by Kirby, et. al., deposited from monomodal slurries comprised of fine rare earth disilicate particles and sintering aids at thicknesses of less than 5 mils are significantly less subject to defects imparted by gravitational force, and thus, simple dip coating, painting, and spraying approaches can be used without generating defects. The invention described here combines the use of the bimodal slurries with sintering aids along with slurry deposition approaches that allow for successful deposition of thick coatings (5-40 mils). The "gel-casting" approach overcomes the thick coating challenges by providing a method to pour a low viscosity slurry (comprising coarse and fine particulate and sintering aid) into a mold surrounding the substrate in order to "mold-in" the coating. The slurry, also containing crosslinkable monomers, is then crosslinked to form an irreversible gel that locks in the coating geometry and prevents settling under the influence of gravity. The geometry of the coating would thus be controlled by the mold geometry, which allows for the possibility of smooth surface or abradable ridges. The "gelled" coating can then be dried and sintered. Alternately, in the direct-write approach, chemical species are introduced to impart weak attraction between the particles in the slurry. In such case, the slurry because a reversible, particle gel that flows in the presence of shear stress but sets up in the absence of shear stress such that it does not flow under the influence of gravity. Also, the reversible gel exhibits strong shear-thinning behavior that prevents settling of the coarse particulate and allows the slurry to maintain shape after extrusion from a syringe. This approach allows for coatings with abradable ridges to be directly written onto the substrate surface with the use of robotic control to position the deposition and extrusion rate. After deposition, the slurry particle gel is dried and sintered. Lastly, it is possible to combine both the "gel-casting" and "particle-gel" approaches described above.

The "gel-casting" and "direct-write" slurries contain at least one, more particularly, two or more liquids; however, the strategy of choosing the liquids depends on the approach. For the "gel-casting" approach, one of the liquids, at a level exceeding 80% of the total liquids, is very low vapor pressure, such that drying is inhibited unless heating to temperatures in excess of about 50° C. is applied. This differs from other gel-casting methods for bulk articles as described by Janney, et al., because it provides the means necessary to ensure that gelation occurs for coating applications, as opposed to drying or a mixture of gelation and drying. The surface to volume ratio is high in coating applications, thus, unless low vapor pressure solvents are used, the slurry would dry before gelation can occur.

For the "direct-write" slurries, at least one of the solvents is a high vapor pressure liquid. This accelerates the time needed to drying a coating at room or slightly elevated temperature, and when used together with at least one low vapor pressure liquid, can have the effect of eliminating certain drying defects as known by those skilled in the art.

More specifically, high vapor pressure liquids refer to water and solvents including but not limited to: methanol, ethanol, propanol, butanol, pentanol, hexanol, heptanol, octanol, nonanol, decanol, dodecanol, acetone, diacetone alcohol, methyl isobutyl ketone (MIBK), methyl ethyl ketone (MEK), toluene, ethylbenzene, propyl benzene, methoxybenzene, heptane, octane, xylene, mineral spirits, naptha (such as VM&P naptha), tetrahydrofuran, ethers, methyl acetoacetonate, ethyl acetoacetonate, and combinations thereof.

More specifically, "low vapor pressure liquid" can refer to glycerine, glycerol, ethylene glycol, propylene glycol, diethylene glycol, diethylene glycol based-ethers such as but not limited to diethylene glycol monobutyl ether, triethylene glycol, tetraethylene glycol, polyethylene glycols of varying molecular weight, dibutyl phthalate, Bis(2-ethylhexyl) phthalate, Bis(n-butyl)phthalate, Butyl benzyl phthalate, Diisodecyl phthalate, Di-n-octyl phthalate, Diisooctyl phthalate, Diethyl phthalate, Diisobutyl phthalate, Di-n-hexyl phthalate, Di(propylene glycol) dibenzoate, Di(ethylene glycol) dibenzoate, tri(ethylene glycol) dibenzoate, and combinations thereof.

The "gel-casting" and "direct-write" slurries differ in the type of "dispersant" included in the slurry. For the gel-casting approach, one or more dispersants may be used to ensure that the primary material particulate and any sintering aid particulate (i.e., if non-soluble sintering aids are used) is uniformly distributed or "dispersed" in the liquid medium. In the gel-casting slurry, if more than one dispersant is used, the dispersants must all be anionic or all cationic. Anionic dispersants can refer to polyacrylic acid, polyacrylic acid, polymethacrylic acid, phosphate esters, sulfonated polymers, polysilazane, copolymers thereof with polyvinyl alcohol, copolymers thereof with polyvinyl acetate, and copolymers thereof with polyethylene oxide. Cationic dispersants can refer to polyethylenimine, poly-N vinyl pyrrolidone, copolymers with polyvinyl alcohol, copolymers with polyvinyl acetate, and copolymers with polyethylene oxide. Utilization of one dispersant or more of the same time ensures that the slurry remains pourable up to loadings of the primary material of up to 60 percent by volume in the slurry (note, the remaining 40 volume percent in the slurry would include liquids, sintering aids, dispersants, and binders (also known as thickeners).

For the "direct-write" approach slurries, two dispersants are used. At first, only one dispersant (either anionic or cationic) is included in the slurry for the purpose of dispersing the primary material particulate and any sintering aid particulate (i.e., if non-soluble sintering aids are used). However, after uniform dispersion is achieved, the oppositely charged dispersant is added and vigorously mixed into the slurry. The addition of the oppositely charged dispersant causes the slurry to become a uniform, reversible gel that may be extruded through a syringe via a direct write process as discussed above. The gel network induced by the oppositely charged, attracting dispersants is sufficient to prevent settling of the coarse particles and ultimately separation of the coarse particles from the fine particles.

In the "gel-casting" approach, the slurry contains a monomer that is soluble in the liquid phase. "Monomer" or "Monomer solution" can refer to a material which crosslinks in the presence of an "initiator". Once this crosslinking occurs, an irreversible gel is formed the preserves the shape of the slurry on the surface of the component. The irreversible gel also locks the dispersed primary material in place, preventing settling of the coarse particles and ultimately separation of the coarse particles from the fine particles. Moreover, the irreversible gel further allows for thicker layers to be formed and dried without cracking, since an irreversible gel is a strong polymer network that can support the stresses induced during drying.

The monomer can include but is not limited to chemistries including: hydroxymethylacrylimide, ethoxymethylacrylamide, methacrylamide, methylene bisacrylamide, acrylamide, methoxy poly(ethylene glycol) monomethacrylate, N-vinyl pyrrolidone, diallyl phthalate, and mixtures thereof. The monomer chemistry must be chosen such that it dissolves in the liquid phase of the slurry, as is obvious to one skilled in the art.

The initiator is a chemical added to a gel-casting slurry to initiate monomer crosslinking and is carried out just before casting. The initiator can be chosen from ammonium persulfate, azobis (2-amidinopropane) HCl, azobis [2-(2-imidazolin-2-yl) propane] HCl, and dicumyl peroxide. Moreover, the initiator can be a photo initiator.

Heat can be used to accelerate the crosslinking process once the monomer and initiator are combined—for example, temperatures up to 50° C. In the case of monomers combined with ammonium persulfate initiator, the reaction can be accelerated by further addition of a chemical catalyst known as tetramethylethylene diamine. In the case of monomers combined with photoinitiator, the crosslinking reaction occurs once ultraviolet radiation is applied. The "gel-casting" approach using photoinitiator and ultraviolet radiation also lends itself to layer-by-layer buildup and photoresist masking such some regions of coating can remain uncured and be washed away. Such an approach can also be used to make abradable ridge patterns.

In the "direct write" approach, the network formed by attraction of oppositely charged polyelectrolytes, although sufficient to generate strong shear thinning behavior characteristic of this "reversible gel", is not as strong as the crosslinked, irreversible gel in the gel-casting approach to support stresses generated during drying. As a result, a binder or "thickener" is used to impart green strength to the deposted slurry and prevent cracking as it dries. Such binders include polyvinyl butyral, polyvinyl acetate, poly(isobutyl methacrylate), poly [(n-butyl methacrylate-co-isobutyl methacrylate)], methyl methacrylate copolymers, ethyl methacrylate copolymers, poly methyl methacrylate, polyethyl methacrylate, poly N-vinylpyrroline, ethyl cellulose, nitrocellulose, and other solvent soluble cellulose derivatives, and combinations thereof.

Surfactants may be used in either "gel-casting" or "direct-write" slurries in order to reduce foam in the slurry. "Surfactant" refers to compositions selected from the group consisting of fluorocarbons, dimethylsilicones, and ethoxylated acetylenic diol chemistries (e.g. commercial surfactants in the Surfynol® series such as Surfynol® 420 and 502 (Air Products and Chemicals, Inc.)), and combinations thereof.

The slurry deposition cycle to form an abradable layer via a gel-casting approach can generally include slurry formation, casting preparation, slurry application, gelation, drying, binder burnout, and sintering. Those skilled in the art will understand that slurries of varying compositions can be used to make EBC layers of varying composition and that multiple slurry deposition cycles can be used to build up the total thickness of the particular layer. However, one advantage of the gel-casting approach is that a thick abradable layer can be made in a single deposition cycle.

As used herein, "organic processing aids" refers to any dispersants, crosslinked polymers, binders, and surfactants present in the slurry. These organic processing aids are comprised primarily of carbon and other elements that volatilize during processing such that they are not present in the post-sintered coating.

The gel-casting slurry can be formed by combining rare earth disilicate primary material with any or all of the previously described slurry constituents including sintering aids, solvents, dispersants, monomers, and surfactants with mixing media in a container. The mixture can be mixed using conventional techniques known to those skilled in the art such as shaking with up to about a 1 inch (about 25.4 mm) diameter alumina or zirconia mixing media, ball milling using about a 0.25 inch to about a 1 inch (about 0.64 cm to about 2.54 cm) diameter alumina or zirconia mixing media, attritor milling using about a 1 mm to about a 5 mm diameter zirconia-based mixing media, planetary ball milling using from about a 1 mm to about a 5 mm diameter zirconia-based media, or mechanical mixing or stirring with simultaneous application of ultrasonic energy. The mixing media or ultrasonic energy can break apart any agglomerated ceramic particles in the slurry. Any mixing media present may then be removed by straining, for example.

If not added previously, binder may optionally be added to the slurry if desired and the resulting mixture may be agitated by such methods as mechanical stirring, rolling, blending, shaking, and other like methods until the thickener is fully dissolved, generally after about 5 to about 60 minutes.

Once all slurry components have been mixed, the slurry can be filtered through screens of varying mesh sizes to remove any impurities that may be present, such as after the initial mixing of the slurry or after use of the slurry to deposit coating layers. A 325 mesh screen, for example, can be used to filter out impurities having an average size of about 44 microns or greater.

After mixing and optional filtering, the slurry can be agitated indefinitely by slow rolling, slow mechanical mixing, or other like methods to avoid trapping air bubbles in the slurry. In one embodiment, the slurry may be refreshed by adding additional solvent to account for that which has evaporated during processing. Alternately, once mixed, the slurry can be set aside until needed for application. Those skilled in the art will understand that the previous embodiment sets forth one method for making the slurry compositions described herein, and that other methods are also acceptable, as set forth in the Examples below.

During casting preparation, the substrate is prepared for deposition of the gel-cast abradable slurry. The environment barrier coating layers would have already been deposited by either a slurry or plasma spray process. Thus, in forming the abradable layer 30, the slurry for such layer 30 is applied to the coated engine component 10, bond coat layer 16, amorphous silica layer 20, or one of the additional layers as desired. The substrate is prepared to receive the abradable slurry by applying molding and masking using conventional techniques known to those skilled in the art. The molding is used to form the shape and thickness of the abradable layer by defining the gap between the base CMC structure 12 and mold surface in which the gel-cast slurry is to be poured. The masking may include but is not limited to tapes, tooling, and paint-on adhesives that prevent the slurry from coating select areas of the substrate. In one embodiment, the molding imparts a smooth surface to the abradable layer. In this case, the smoothness is determined by the smoothness of the mold surface. In another embodiment, molding may be of special design to impart a texture on the surface of the abradable layer, such as a series of abradable ridges.

Once the substrate is prepared, the abradable slurry is prepared for casting by adding the initiator. The initiator is added at an amount of up to 2% of the weight of the liquids and mixed vigorously. Entrained air in the slurry due to the vigorous mixing can be removed by vacuum application in a dessicator. Once the abradable layer slurry, with initiator, is poured into the mold, time is allowed to elapse until crosslinking is complete and the slurry is irreversibly gelled. The wait time can be minimized via heat application (25° C.-85° C.) and potentially, application of UV light. After gelation, the green strength of the coating is sufficient for handling, masking removal, and mold removal.

Optionally, one or more additional layers of slurry may be placed on the first gelled layer to form additional gelled layers. It should be understood that the last layer applied is the abradable layer 30 which may be molded as previously described.

In an alternate embodiment, the gel-cast slurry is built-up up with multiple shallow passes where there is no mold and the slurry is irreversibly gelled after each thin layer is deposited. In this case the gel-cast slurry may be deposited by dipping the component into a slurry bath, painting, rolling, stamping, spraying, or pouring the slurry onto the component. Slurry application can be carried out manually or it may be automated.

Once the slurry has been applied to the component, and while the slurry is still wet, it may be leveled to remove excess slurry material. Leveling may be carried out using conventional techniques such as, but not limited to, spinning, rotating, slinging the component, dripping with or without applied vibration, or using a doctor blade, to remove excess slurry material. Similar to the slurry application, leveling can be conducted manually or it may be automated.

Next, the coated engine component 10 with irreversibly gelled abradable layer is dried. Since the solvent used in the gel-casting slurry approach is low vapor pressure such that is does not dry at room temperature, drying may be carried out in a furnace or drying oven and heated at a slow rate of 0.5-5° C./min to a low temperature of 85° C.-285° C. (with or without a hold time) to evaporate the liquids. In another embodiment, drying is carried out by enclosing in a vacuum chamber and pulling a vacuum to evaporate the liquids. In yet another embodiment, the liquid is extracted by a diffusive or osmotic process by placing the gelled abradable coating in contact with a material that provides such a driving force to extract the liquid from the irreversible gel. Drying may be carried out either before or after mold removal, although if before mold removal, appropriate mold materials that can withstand the drying environment should be used.

Next, burnout of the organic processing aids may be carried out by placing the dried component in an elevated temperature environment so that any organic processing aids can be pyrolyzed. In one embodiment, burnout of the organic processing aids may be accomplished by heating the dried component at a rate of from about 1° C./min to about 15° C./min to a temperature of from about 275° C. to about 1000° C. and holding the component at this temperature for from about 0 to about 10 hours. In another embodiment, the coated component may be heated at a rate of from about 2° C./min to about 6° C./min to a temperature of from about 600° C. to about 800° C. and holding the component at this temperature for from about 0 to about 10 hours. In another embodiment, the hold time can be eliminated by slowly ramping up to the target temperature without holding, followed by ramping up or down to another temperature at a different rate. In another embodiment, binder burnout can occur rapidly by placing the coated component into a furnace heated to a temperature of from about 400° C. to about 1400° C.

The burned-out coated engine component 10 may then be sintered to produce a component comprising an environmental barrier coating 14 including at least the abradable layer 30. Sintering can serve to simultaneously densify, impart strength to the coating, and dope the primary material with the sintering aid "doping composition". Sintering can be carried out using a conventional furnace, or by using such methods as microwave sintering, laser sintering, infrared sintering, and the like.

Sintering can be accomplished by heating the burned-out component at a rate of from about 1° C./min to about 15° C./min to a temperature of from about 1100° C. to about 1375° C. and holding the component at that temperature for from about 0 to about 24 hours. After sintering, the abradable layer 30 has a thickness of greater than about 6 mils and a porosity of between about 5 percent to about 50 percent.

The slurry deposition cycle to form an abradable layer via a direct-write approach can generally include slurry formation, casting preparation, slurry application, drying, binder burnout, and sintering. Those skilled in the art will understand that slurries of varying compositions can be used to make EBC layers of varying composition and that multiple slurry deposition cycles can be used to build up the total thickness of the particular layer. However, an advantage of the direct-write approach is that a thick abradable layer can be made in a single deposition cycle.

The direct-write slurry of the FIG. 3 embodiment can be formed by combining rare earth disilicate primary material with any or all of the previously described slurry constituents including sintering aids, solvents, dispersants, and surfactants with mixing media in a container. The mixture can be mixed using conventional techniques known to those skilled in the art such as shaking with up to about a 1 inch (about 25.4 mm) diameter alumina or zirconia mixing media, ball milling using about a 0.25 inch to about a 1 inch (about 0.64 cm to about 2.54 cm) diameter alumina or zirconia mixing media, attritor milling using about a 1 mm to about a 5 mm diameter zirconia-based mixing media, planetary ball milling using from about a 1 mm to about a 5 mm diameter zirconia-based media, or mechanical mixing or stirring with simultaneous application of ultrasonic energy. The mixing media or ultrasonic energy can break apart any agglomerated ceramic particles in the slurry. Any mixing media present may then be removed by straining, for example.

A secondary dispersant that is of opposite charge than the first dispersant (already in the slurry) is added after the slurry is formed as described above, The addition of the secondary dispersant is followed by vigorous mixing using any of the mixing methods described above. Shortly after the addition of the oppositely charged dispersant and mixing, the slurry becomes a strongly shear-thinning, reversible gel.

The reversible gel can be applied by extruding the material onto the component through an orifice. The orifice diameter and shape can be chosen to affect the size and shape of the extruded bead, that ultimately becomes an abradable ridge. The reversible gel can be deposited at full thickness in a single pass, or multiple passes can be used to build up the material. Unique "spanning" structures can also be formed by overlaying the series of patterned abradable ridges with passes that are 90 degrees, 45 degrees, or some angle of choice with respect to one another. The spacing of the abradable ridges defines the length at which the next layer of reversible gel slurry must span the ridges of the prior layer. The strong, shear thinning rheology of the reversible gel enables this spanning behavior.

The reversible gel can be applied by hand, or via robotic deposition so that the material can be placed uniformly in a well-controlled manner. The robotic deposition can also be automated to a high level to reduce touch time required by a human operator.

The reversible gel, after being applied, can be further shaped by overlaying a mold to force the material to conform to a certain thickness or surface texture.

After deposition, the reversible gel is dried at room or slightly elevated temperatures up to 85° C.-285° C.

Next, burnout of the organic processing aids may be carried out by placing the dried component in an elevated temperature environment so that any organic processing aids can be pyrolyzed. In one embodiment, burnout of the organic processing aids may be accomplished by heating the dried component at a rate of from about 1° C./min to about 15° C./min to a temperature of from about 275° C. to about 1000° C. and holding the component at this temperature for from about 0 to about 10 hours. In another embodiment, the coated component may be heated at a rate of from about 2° C./min to about 6° C./min to a temperature of from about 600° C. to about 800° C. and holding the component at this temperature for from about 0 to about 10 hours. In another embodiment, the hold time can be eliminated by slowly ramping up to the target temperature without holding, followed by ramping up or down to another temperature at a different rate. In another embodiment, binder burnout can occur rapidly by placing the coated component into a furnace heated to a temperature of from about 400° C. to about 1400° C.

The burned-out coated engine component 10 may then be sintered to produce a component comprising an environmental barrier coating 14 including at least the abradable layer 30. Sintering can serve to simultaneously densify, impart strength to the coating, and dope the primary material with the sintering aid "doping composition". Sintering can be carried out using a conventional furnace, or by using such methods as microwave sintering, laser sintering, infrared sintering, and the like.

Sintering can be accomplished by heating the burned-out component at a rate of from about 1° C./min to about 15° C./min to a temperature of from about 1100° C. to about 1375° C. and holding the component at that temperature for from about 0 to about 24 hours. After sintering, the abradable layer 30 has a thickness of greater than about 6 mils and a porosity of between about 5 percent to about 50 percent.

Binder burnout and sintering heat treatments for either gel-casting or direct write approaches may be carried out in an ambient air atmosphere or in a gas atmosphere where the gas is selected from nitrogen, hydrogen, a noble gas such as helium, neon, argon, krypton, xenon, mixtures thereof, or mixtures thereof with oxygen.

In an alternate embodiment, some or all layers of the EBC including the abradable layer 30 can be applied, one on top of the other, before masking removal, drying, organic processing aid burnout, and sintering are carried out. Those skilled in the art will understand that after application of each layer, the layer should be gelled before the application of the subsequent layer.

In another embodiment, the sintering aid does not need to be added directly to the transition or outer layer of the slurry to achieve the desired result. The sintering aid can be added to one layer of the EBC slurry, and during sintering, the sintering aid can diffuse throughout the EBC to the remaining layers. In another embodiment, a primary material slurry with no sintering aid can be densified by applying the layer, allowing it to dry, and then back infiltrating a sol-gel solution comprising a sintering aid prior to heat treatment as explained below.

Infiltration may allow for the densification of a thicker layer of EBC material at one time. Moreover, infiltration is a way to add more sintering aid after sintering if the coating is not as dense as desired. The sol-gel solution used for infiltration may be a solution of an organic solvent and a solvent soluble salt sintering aid, or a solution of water and a water soluble salt sintering aid as defined previously.

Without intending to be limited by theory, the inclusion of sintering aids to the EBC embodiments herein can increase the rate of diffusion of primary material such that surface area reduction (i.e. high surface area particles consolidating to form a dense coating) can occur at lower temperatures than it would have absent the sintering aid. As previously described, sintering at lower temperatures (i.e. about 1344° C. or below) can not only result in a highly dense coating that can be less susceptible to the penetration of hot steam from the engine environment, but can also help prevent the degradation of the mechanical properties of the underlying component that could result from prolonged exposure to higher temperatures.

Sintering aids can act in a variety of ways depending on the amount of sintering aid included in the EBC and the time at which the coating is exposed to sintering temperatures. For example, in one embodiment, the sintering aid can dissolve completely into the primary material to "dope" the material. In another embodiment, if the amount of sintering aid that is soluble in the primary material is exceeded, the remaining insoluble portion of sintering aid can react with the primary material to form the secondary material). In another embodiment, primary material and secondary material can be present as described previously, along with residual sintering aid. In some embodiments, the sintering aid completely dissolves however, it is also desirable that no more than 10% of the secondary material remain following sintering.

In these latter two embodiments, when the secondary material is highly volatile in high temperature steam, as long as the total volume of secondary material, plus porosity (plus residual sintering aid when present) in either of the intermediate layer or compliant layer (when present) of the EBC remains about 15% by volume or less, the hermetic seal can be maintained. Alternately, in these latter two embodiments, when the secondary material is highly resistant to volatilization in high temperature steam, such as when the secondary material comprises a rare earth containing compound, such as but not limited to rare earth oxide, rare earth titanate, rare earth iron compound, rare earth gallate, rare earth aluminate, rare earth indium oxide, and rare earth aluminosilicate, the porosity in either of the intermediate or compliant layer (when present) of the EBC need remain about 15% by volume or less to maintain the hermetic seal. The hermeticity is particularly important for the transition layer described by Kirby et al., but is not necessary for the abradable layers described here that can have porosity up to 50 percent by volume.

It should be noted that at low levels of sintering aid, the densified coating layer might not initially include any detectable secondary materials. In some embodiments, the secondary materials may never become detectable. In other embodiments, however, after hours of exposure to high temperature steam in the engine environment, the secondary materials can become detectable using techniques such as x-ray diffraction, electron microscopy, electron dispersive spectroscopy (EDS), and the like.

EBC embodiments described herein can offer a variety of benefits over current EBCs and manufacturing processes thereof. Specifically, as previously described, the inclusion of a sintering aid in the EBC embodiments herein can permit sintering at lower temperatures (i.e. about 1350° C. or below). This can result in a highly dense coating that can be less susceptible to the penetration of hot steam from the engine environment, and can also help prevent the degradation of the mechanical properties of the underlying component that could result from prolonged exposure to higher temperatures. Also, the embodiments set forth herein can be made at less expense than current EBCs due to the use of the slurry deposition process, which is made possible by the incorporation of sintering aids into the various layers. Moreover, the present embodiments can provide for EBCs having a more uniform thickness than conventional techniques, such as plasma spraying, even when applying thin layers (<2 mils). Additionally, the slurry deposition process can allow for the application of the EBCs to internal component passages as well as the ability to produce smooth surface finishes without an additional polishing step.

There can be occasions when the EBC develops small and/or narrow defects (e.g. about 10 microns to about 5 mm in diameter; or about 10 microns to about 1 mm in width) that need to be repaired. The following repair processes are applicable to the EBCs described herein and may be carried out after sintering of an individual EBC layer, or after sintering the entire applied EBC, as explained herein below.

In one embodiment, repairs may include remedying defects in one or more individual layers as the EBC is being applied using the methods described herein. In this embodiment, the repair can be carried out after sintering a given layer by applying a repair slurry comprising the same slurry materials used to make the layer having the defects. For example, if the transition layer develops a defect after sintering, the defect could be repaired using a "transition layer repair slurry" that comprises the same transition layer slurry materials used in the original application of the transition layer. In one embodiment, the repair slurry can comprise a higher solids loading of primary material ceramic particles than the original slurry layer as this can reduce shrinkage on drying and sintering of the repaired portion of the coating. In particular, the solids loading of primary material ceramic particles in the repair slurry can be greater than about 30% to about 55% by volume (as opposed to greater than about 10% by volume in one embodiment of the original slurry, and from about 10% to about 55% by volume in another embodiment of the original slurry used to make the layer). The repair slurry may be applied using any conventional method including those described previously, as well as with the gel-casting and direct-write processes described herein. The resulting "repair(ed) coating" may then be processed as described previously herein before application of any subsequent layer of the EBC.

In an alternate embodiment, repairs may include fixing defects after application and sintering of the entire EBC. In this embodiment, the repair may be carried out on the EBC having defects using a layer repair slurry comprising the same materials present in the previously defined abradable layer slurry (i.e. primary material, a sintering aid, and optionally secondary material) with exception of the coarse fraction of the primary transition material. This particular repair slurry can seep into any defects present in the EBC and provide a hermetic seal to the repaired EBC coating after sintering. Again, the solids loading of the transition layer repair slurry may comprise upwards of about 30% to 55% by volume.

Such repair processes can provide the ability to repair localized defects, at varying points during the application or life of the coating, as opposed to stripping off and reapplying the entire coating. This, in turn, can result in a savings of time, labor, and materials.

EXAMPLES

Example 1: Gel-Casting Approach

Glycerol (low vapor pressure liquid), N-(hydroxymethyl) acrylamide (monomer), polyacrylic acid-polyethylene oxide copolymer (anionic dispersant), yttrium-doped ytterbium disilicate (primary material), $Fe_3O_4$ iron oxide (sintering aid), and $Al_2O_3$ (sintering aid) were combined in a plastic bottle along with 0.25" diameter yttrium-doped zirconium dioxide milling media. The mixture was rolled on a roller mill for at least 12 hours.

A 10 percent (by weight) ammonium persulfate initiator solution was then dosed into the slurry followed by vigorous mixing by hand for several minutes.

Next, the slurry was cast on top of a silicon carbide coupon that already had a silicon metal bond coat deposited via a chemical vapor deposition process and a Fe-doped ytterbium disilicate transition layer (hermetic with 5 percent porosity or less) deposited via a slurry deposition process. The slurry was leveled using a doctor blade to remove excess slurry and set the desired thickness.

The slurry was then heated to 50° C. for 30 minutes to irreversibly gel the slurry.

Next, the gelled slurry was dried by heat at a rate of 1.5° C./min to 150° C.

Binder burnout was then carried out by heating at a rate of 3° C./min to 550° C.

Finally, sintering was carried out by heating at a rate of 10° C./min to 1344° C. (holding for 10 hours at 1344° C.).

Figure 4:
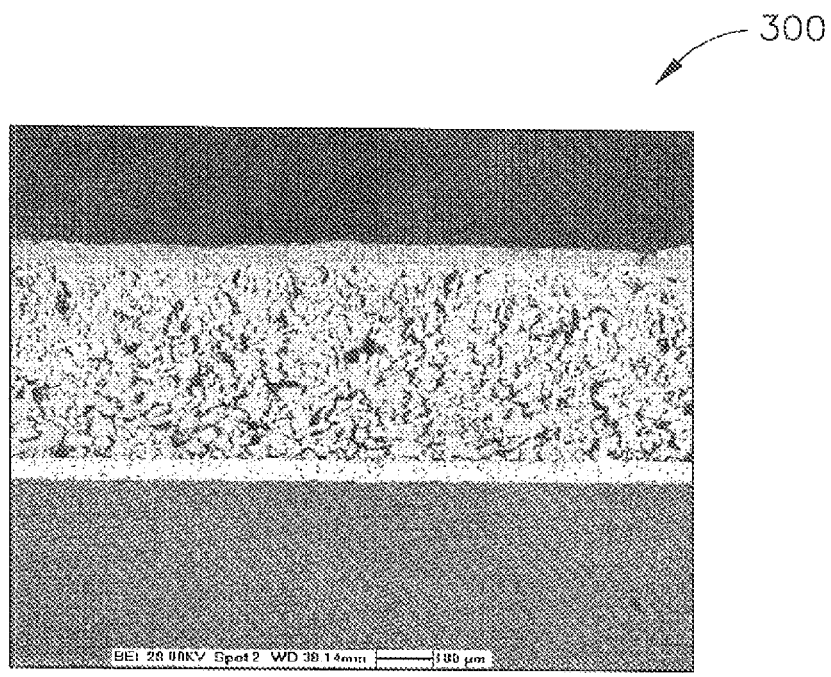
FIG. 4 is a cross-section produced by a scanning electron microscope.

After cooling, the sample was cross-sectioned and mounted in epoxy for scanning electron microscope (SEM) evaluation and the resulting backscatter image is shown in FIG. 4. In the Figure, the backscatter SEM cross-section of an EBC coating includes the following: (A) silicon bond coat deposited via a chemical vapor deposition (CVD) process, (B) Fe-doped ytterbium disilicate transition layer deposited via a slurry-deposition approach, and (C) Fe-doped, yttrium-doped ytterbium disilicate abradable layer deposited via a gel-casting slurry approach and (D) a Fe-doped yttrium monosilicate layer deposited via a slurry-deposition approach on the very top.

Example 2: Direct-Write Approach 1-hexanol (high vapor pressure liquid), diethylene glycol monobutyl ether (low vapor pressure liquid), yttrium-doped ytterbium disilicate powder (coarse average particle size primary material), yttrium-doped ytterbium disilicate (fine average particle size primary material), $Fe_3O_4$ iron oxide (sintering aid), $Al_2O_3$ aluminum oxide (sintering aid), and poly N-vinylpyrrolidone (cationic dispersant, binder) were combined in a plastic bottle along with 0.25" diameter spherical yttrium doped zirconium oxide media. The mixture was rolled on a roller mill for at least 12 hours. Next, a 50% aqueous solution of polyacrylic acid was added to the slurry, followed by rapid stirring by hand. After about 1 minute of stirring, the slurry became a strongly shear-thinning, reversible gel suitable for direct write deposition.

Next, the reversible gel "direct-write" slurry was extruded through a syringe on top of a silicon carbide coupon that already had a silicon metal bond coat deposited via a chemical vapor deposition process and a Fe-doped ytterbium disilicate transition layer (hermetic with 5 percent porosity or less) deposited via a slurry deposition process.

Next, the slurry was dried by heating at a rate of 1.5° C./min to 150° C.

Binder burnout was then carried out by heating at a rate of 3 C./min to 550° C.

Finally, sintering was carried out by heating at a rate of 10° C./min to 1344° C. (holding for 10 hours at 1344° C.).

Figure 5:
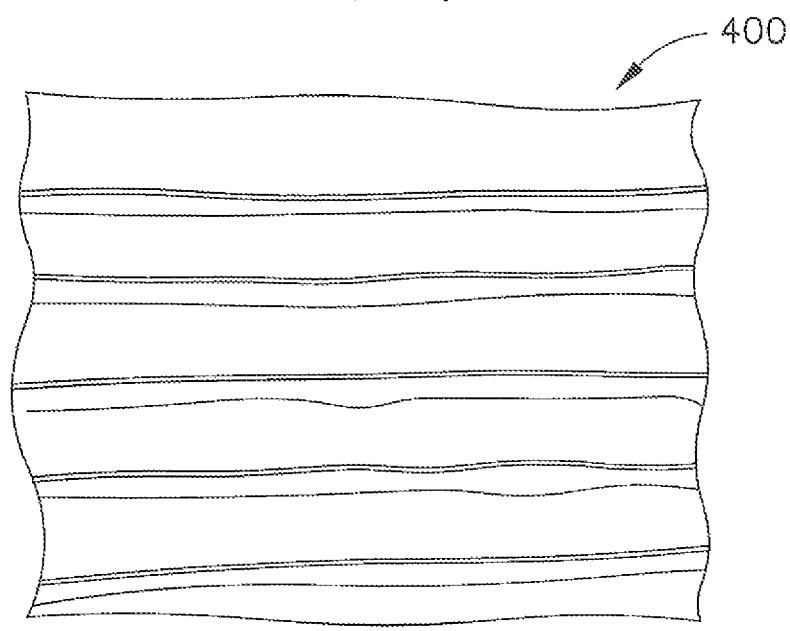
FIG. 5 is a cross-section microscopic view of a sample direct written abradable layer having a pattern.

After cooling, the sample 400 was characterized via a stereomicroscope as shown in FIG. 5 which depicts optical microscope cross-section of Fe-doped, yttrium-doped ytterbium disilicate abradable ridges that were directly written using a reversible gel slurry.

The foregoing description of structures and methods has been presented for purposes of illustration. It is not intended to be exhaustive or to limit the structures and methods to the precise forms and/or steps disclosed, and obviously many modifications and variations are possible in light of the above teaching. Features described herein may be combined in any combination. Steps of a method described herein may be performed in any sequence that is physically possible. It is understood that while certain forms of composite structures have been illustrated and described, it is not limited thereto and instead will only be limited by the claims, appended hereto.

While multiple inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Examples are used to disclose the embodiments, including the best mode, and also to enable any person skilled in the art to practice the apparatus and/or method, including making and using any devices or systems and performing any incorporated methods. These examples are not intended to be exhaustive or to limit the disclosure to the precise steps and/or forms disclosed, and many modifications and variations are possible in light of the above teaching. Features described herein may be combined in any combination. Steps of a method described herein may be performed in any sequence that is physically possible.

All definitions, as defined and used herein, should be understood to control over dictionary definitions, definitions in documents incorporated by reference, and/or ordinary meanings of the defined terms. The indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases.

It should also be understood that, unless clearly indicated to the contrary, in any methods claimed herein that include more than one step or act, the order of the steps or acts of the method is not necessarily limited to the order in which the steps or acts of the method are recited.

The invention claimed is:

1. A method of depositing an abradable coating on a gas turbine engine component comprising:
   forming a slurry mixture comprising at least bi-modal ceramic particulate with up to about 70% by volume of coarse particulate wherein said coarse particulate is at least one of Ln2Si2O7, Ln2SiO5, silica, barium strontium aluminosilicate (BSAS), monoclinic hafnium oxide, rare earth gallium garnet (Ln2Ga2O9), where Ln is at least one of Scandium (Sc), Yttrium (Y), Lanthanum (La), Cerium (Ce), Phraseodymium (Pr), Neodymium (Nd), Promethium (Pm), Samarium (Sm), Europium (Eu), Gadolimium (Gd), Terbium (Tb), Dysprosium (Dy), Hlomium (Ho), Erbium (Er), Thulium (Tm), Ytterbium (Yb), Lutetium (Lu), and up to about 65% by volume of fine particulate, wherein said fine particulate includes at least one of Ln2Si2O7 or Ln2SiO5 where Ln is at least one of Sc, Y, La, Ce, Pr, Nd, Pm, Sm, Eu, Gd, Tb, Dy, Ho, Er, Tm, Yb, Lu, a polymer solution consisting essentially of one anionic and one cationic dispersant such that the slurry becomes a reversible gel, a low vapor pressure organic solvent and at least one sinter aid selected from the group consisting of iron, aluminum, titanium, cobalt, nickel, gallium, indium, or any compounds thereof;
   direct writing said reversible gel slurry to said gas turbine engine component;
   drying said reversible gel slurry at one of room temperature or a second temperature between about 30° C.-80° C. to form a reversible gel matrix; and,
   sintering said dried reversible gel matrix on said gas turbine engine component at a temperature greater than about 1204° C. and less than 1357° C., forming a layer of said abradable coating having a thickness greater than about 5 mils and a porosity of about 5 percent to about 50 percent, wherein said sintered layer is also comprised of a doped rare earth disilicate where said at least one sintering aid is a doping composition that dissolves into, and dopes the rare earth disilicate.

2. The method of claim 1, placing said gas turbine component and said direct written gel in a mold.

3. The method of claim 1, wherein said direct writing creates a pattern on said gas turbine engine component.

4. The method of claim 3, wherein said pattern being a plurality of ridges.

5. The method of claim 1, wherein said direct write process is automated using robotic deposition.

6. The method of claim 1, wherein the direct write process builds up a series of abradable ridges of multiple layers where the ridges span those of the prior layer.

7. The method of claim 1, wherein said gas turbine component is one of a blade and a shroud.

8. The method of claim 1, wherein said gas turbine component is formed of ceramic matrix composite (CMC).

9. The method of claim 8, wherein said gas turbine engine component comprises an environmental barrier coating.

10. The method of claim 9, wherein said abradable coating is disposed on said environmental coating.

11. A method of depositing an abradable coating on a gas turbine engine component with an environmental coating on an outer surface of said gas turbine engine component, comprising:
   forming a slurry mixture comprising at least bi-modal ceramic particulate with up to about 70% by volume of coarse particulate wherein said coarse particulate is at least one of Ln2Si2O7, Ln2SiO5, silica, barium strontium aluminosilicate (BSAS), monoclinic hafnium oxide, rare earth gallium garnet (Ln2Ga2O9) where Ln is at least one of Scandium (Sc), Yttrium (Y), Lanthanum (La), Cerium (Ce), Phraseodymium (Pr), Neodymium (Nd), Promethium (Pm), Samarium (Sm), Europium (Eu), Gadolimium (Gd), Terbium (Tb), Dysprosium (Dy), Hlomium (Ho), Erbium (Er), Thulium (Tm), Ytterbium (Yb), Lutetium (Lu), and up to about 65% by volume of fine particulate wherein said fine particulate includes at least one Ln2Si2O7 or Ln2SiO5 where Ln is at least one of Sc, Y, La, Ce, Pr, Nd, Pm, Sm, Eu, Gd, Tb, Dy, Ho, Er, Tm, Yb, Lu, a polymer solution consisting essentially of one anionic and one cationic dispersant such that the slurry becomes a reversible gel, a low vapor pressure organic solvent and at least one sinter aid selected from the group consisting of iron, aluminum, titanium, cobalt, nickel, gallium indium, or any compounds thereof;

direct writing said reversible gel slurry to said gas turbine engine component;

drying said reversible gel slurry at one of room temperature or a second temperature between about 30° C.-80° C. to form a reversible gel matrix; and, sintering said dried reversible gel matrix on said gas turbine engine component at a temperature greater than about 1204° C. and less than 1357° C., forming a layer of said abradable coating having a thickness greater than about 5 mils and a porosity of about 5 percent to about 50 percent, wherein said sintered layer is also comprised of a doped rare earth disilicate where said at least one sintering aid is a doping composition that dissolves into, and dopes the rare earth disilicate.

12. The method of claim 11 wherein said gas turbine engine component is formed of ceramic matrix composite (CMC).

13. The method of claim 11 further comprising the environmental coating disposed between said gas turbine engine component and said abradable layer.

* * * * *